Jan. 31, 1961 F. M. DUKAT 2,970,213

HYBRID RADIO RECEIVING CIRCUITS

Original Filed Oct. 22, 1954

INVENTOR
FRANCIS M. DUKAT
BY Elmer J. Gorn
ATTORNEY 2,970,213

HYBRID RADIO RECEIVING CIRCUITS

Francis M. Dukat, Waltham, Mass., assignor to Raytheon Company, a corporation of Delaware Continuation of abandoned application Ser. No. 463,875, Oct. 22, 1954. This application Dec. 19, 1957, Ser. No. 703,943

4 Claims. (Cl. 250—20)

This application is a continuation of my prior copending application, Serial No. 463,875, filed October 22, 1954, now abandoned, and assigned to the same assignee as the present application.

This invention relates generally to radio receivers and more particularly to a novel hybrid receiving circuit capable of use in a portable type radio wherein a transistor is utilized as the output stage of the receiver.

A hybrid receiver, as the term is used in this application, is defined as a receiver having some of its conventional stages, for example, the radio frequency, mixer, intermediate frequency, detector and audio frequency stages composed of electronic tubes while the output stage is a transistor. In the interests of optimum gain, efficiency, and stability an ideal transistor output stage should have its collector operating from a relatively high voltage source, and the emitter supplied from a constant current source. It is also desirable that current regulation be obtained with a minimum amount of wasted power. In accordance with the present invention, an improved receiving circuit is provided in which a transistor is incorporated having current supplied to its emitter through the filament string of the previous stages, and collector voltage supplied by the B battery providing the plate voltage for the previous stages thus accomplishing stable operation and high gain with practically no expenditure of power for stabilization purposes.

The invention will be better understood as the following description proceeds taken in conjunction with the accompanying drawing wherein.

Figures 1, 2, 3, 4:
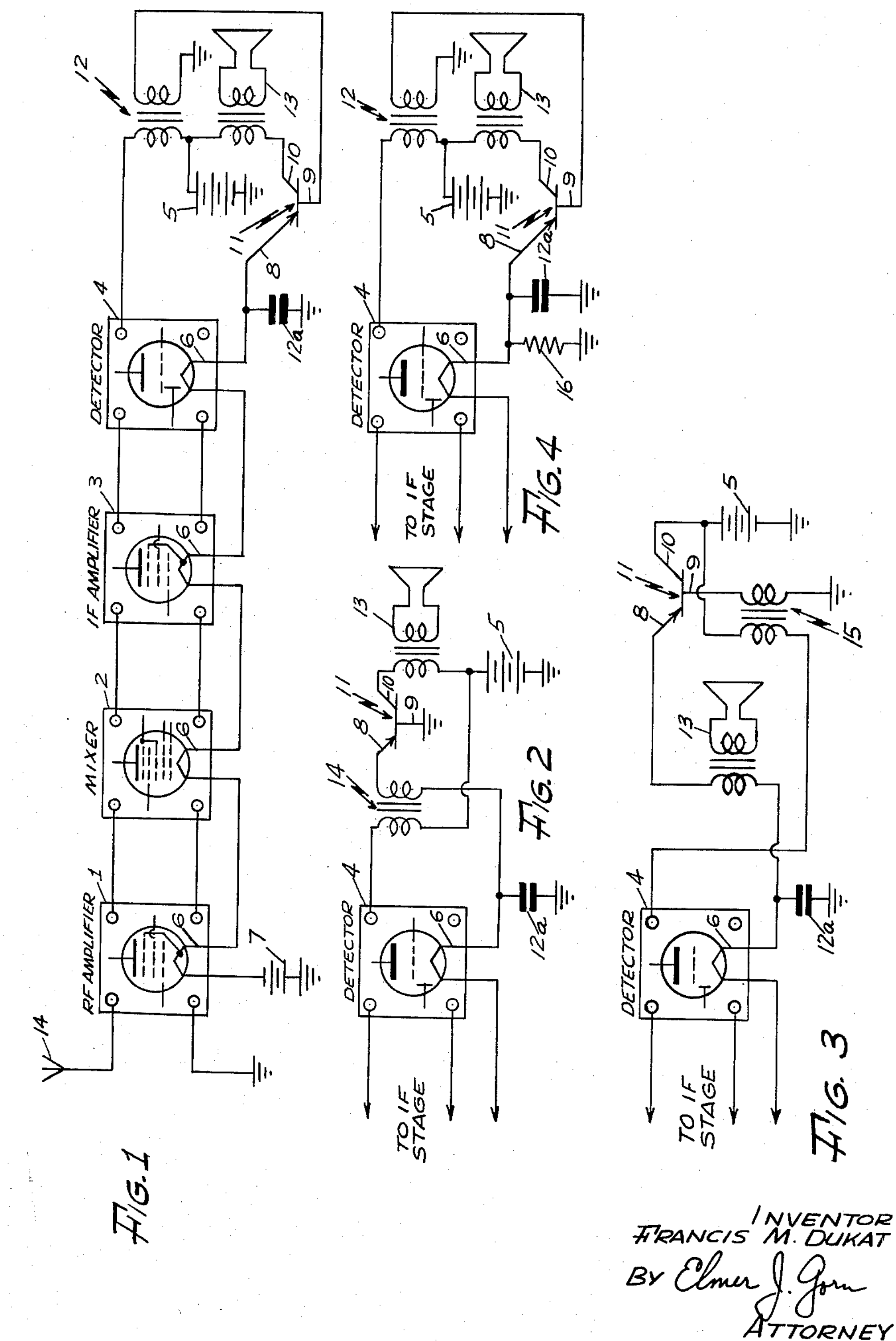
Fig. 1 is a schematic drawing partly diagrammatic of a receiving circuit in accordance with the present invention.
Fig. 2 shows another arrangement of the transistor output stage.
Fig. 3 shows still another possible arangement of the transistor output stage.
Fig. 4 shows an arrangement for operating the transistor output stage at lower power.

Referring now to the drawings and more particularly to Fig. 1, there is shown a radio receiving circuit, which may be of the superheterodyne type, comprising in part a radio frequency amplifier stage 1, a mixer stage 2, an intermediate frequency stage 3, and a detector-audio amplifier stage 4. A B battery 5 supplies the plate voltage for the various stages of the circuit, and also biases the collector 10 of a transistor designated generally at 11. The filaments 6 of the electronic tubes comprising the aforementioned stages are arranged in series with one end of the string connected to a battery 7 in order to supply heating current to the filaments. The other end of the string is connected to the emitter 8 of a transistor 11 which is preferably of the NPN type. A bypass condenser 12 eliminates unwanted audio frequency currents from the filament string.

An incoming radio signal, after being intercepted by antenna 14, is amplified in the high frequency amplifier

1, and heterodyned in mixer stage 2. The resulting impulses of intermediate frequency may be amplified in one or more stages in the intermediate frequency amplifier 3, and then subjected to detection and low frequency amplification, the process being shown here as combined in the single tube of stage 4. The audio output signal from the detector-audio stage is fed into the base connection 9 of the transistor 11 through a transformer 12, thereby providing the necessary power amplification to actuate loudspeaker 13 in accordance with the detected signal.

In order to obtain optimum gain and efficiency in the output stage, transistor 11 has its collector 10 connected to the relatively high source of voltage supplied by the battery 5, which also supplies the plate voltage for the tubes used in the previous stages. Depending on tube and transistor technology, almost any value may be used for battery 5; however, 30 volts represents a reasonable compromise between tube and transistor capabilities at the present time. In order to provide for stable operation of transistor 11, the emitter 8 is connected to the filament string of the prior stages, thereby allowing a constant regulated current to be applied to the emitter.

The invention is not limited to the arrangement of Fig. 1. If desired, transistor 11 may be operated with a common base connection, as shown in Fig. 2, in which case the output from detector stage 4 is applied to the emitter 8 through transformer 14, and the signal is then reproduced in loudspeaker 13 coupled into the circuit of collector 10. Alternatively, the common collector connection shown in Fig. 3 may be used wherein the output signal is applied to base connection 9 through transformer 15, and loudspeaker 13 is coupled into the circuit of emitter 8.

If it is desired to operate the receiving circuit of Fig. 1 at lower power, a grounded resistor 16, as shown in Fig. 4, may be connected to the emitter 8 to bleed off some of the filament string current.

Although there has been shown what is considered to be a preferred embodiment of the invention, various adaptations and modifications thereof may be made without departing from the spirit and scope of the invention as defined in the appended claims.

What is claimed is:

1. A radio receiving circuit comprising a plurality of stages for amplifying, mixing, and detecting an incoming radio frequency signal, at least one of said stages including a transistor and at least one of the remaining stages including an electronic tube, said tube stages having the heaters connected in series with each other, with a source of current, and with the emitter-base circuit of said transistor, and a source of voltage connected to the plates of said tube stages and to the collector of said transistor.

2. A radio receiving circuit comprising a plurality of stages for amplifying, mixing, and detecting an incoming radio frequency signal, at least one of said stages including a transistor and the remaining stages including electronic tubes having their heaters connected in series with each other, a source of current, and the emitter-base circuit of said transistor, and a source of voltage connected to the plates of said tubes and to the collector of said transistor.

3. A radio receiving circuit comprising a plurality of stages of electronic tubes for amplifying, mixing, and detecting an incoming radio frequency signal, said tubes having their heaters connected in series and at least one of said tubes being an audio amplifier, a source of voltage connected to the plates of said tubes, a source of heating current serially connected between said heaters and ground, and an output stage comprising a transistor having an emitter, base, a collector connection, one of said connections being grounded, another of said connections being serially connected to said heaters and to said current source, and the remaining of said connections being made to said voltage source.

4. A radio receiving circuit comprising a plurality of stages of electronic tubes for amplifying, mixing, and detecting an incoming radio frequency signal, said tubes having their heaters connected in series with at least one of said tubes being an audio amplifier, a source of voltage connected to the plates of said tubes, a source of heating current connected in series with said heaters, and a transistor having its emitter-base circuit connected in series with said heaters and with said current source, its collector connected to said voltage source, and the output from said audio stage applied to its base.

References Cited in the file of this patent

UNITED STATES PATENTS

| | | |
|---|---|---|
| 1,762,945 | Anderson | June 10, 1930 |
| 2,647,957 | Mallinckrodt | Aug. 4, 1953 |
| 2,647,958 | Barney | Aug. 4, 1953 |
| 2,712,066 | Wiegerinck | June 28, 1955 |

FOREIGN PATENTS

| | | |
|---|---|---|
| 150,232 | Australia | Nov. 2, 1950 |

OTHER REFERENCES

"A Crystal Receiver With Transistor Amplifier," by Turner, Radio and Television News, January 1950, pages 38, 39, 153, 154 155.

Article: "High-Gain Low-Drain Portable Radio," by Queen, in March 1954, Radio Electronics, at pages 84, 86, 87 and 90.